(12) United States Patent
Ristoiu et al.

(10) Patent No.: US 11,469,095 B2
(45) Date of Patent: Oct. 11, 2022

(54) ETCHING METHOD

(71) Applicant: STMicroelectronics (Crolles 2) SAS, Crolles (FR)

(72) Inventors: Delia Ristoiu, St. Ismier (FR); Pierre Bar, Grenoble (FR); Francois Leverd, St. Ismier (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 16/709,251

(22) Filed: Dec. 10, 2019

(65) Prior Publication Data

US 2020/0211835 A1    Jul. 2, 2020

(30) Foreign Application Priority Data

Dec. 26, 2018  (FR) ...................................... 1874151

(51) Int. Cl.
| | | |
|---|---|---|
| *H01L 21/311* | (2006.01) | |
| *H01L 21/02* | (2006.01) | |
| *H01L 21/67* | (2006.01) | |

(52) U.S. Cl.
CPC .. *H01L 21/02019* (2013.01); *H01L 21/31116* (2013.01); *H01L 21/67253* (2013.01)

(58) Field of Classification Search
CPC ...................... H01L 21/31144; H01L 21/31116
See application file for complete search history.

(56) References Cited

U.S. PATENT DOCUMENTS

| | | | | |
|---|---|---|---|---|
| 4,857,141 A | * | 8/1989 | Abe ................... | H01L 21/31116 438/640 |
| 5,039,623 A | * | 8/1991 | Maas .................. | H01L 21/2257 257/E21.375 |
| 5,229,785 A | * | 7/1993 | Leban ................... | B41J 2/1631 29/890.1 |
| 9,484,298 B1 | | 11/2016 | Noda et al. | |
| 2001/0004552 A1 | | 6/2001 | Tang et al. | |
| 2004/0127001 A1 | * | 7/2004 | Colburn .............. | H01L 23/5329 438/586 |
| 2006/0220003 A1 | * | 10/2006 | Noguchi ............... | H01L 27/105 257/22 |
| 2006/0258159 A1 | * | 11/2006 | Colburn ............ | H01L 21/31144 438/694 |
| 2013/0228853 A1 | | 9/2013 | Higuchi et al. | |
| 2015/0371830 A1 | * | 12/2015 | Takahashi ......... | H01J 37/32146 216/49 |
| 2016/0307915 A1 | * | 10/2016 | Pang ................... | H01L 29/7827 |
| 2017/0323907 A1 | * | 11/2017 | Kitagawa .............. | G02F 1/1343 |
| 2018/0277354 A1 | | 9/2018 | Chang et al. | |

(Continued)

FOREIGN PATENT DOCUMENTS

CN          106548979 A      3/2017

OTHER PUBLICATIONS

INPI Search Report and Written Opinion for FR 1874151 dated Oct. 7, 2019 (10 pages).

*Primary Examiner* — Thomas T Pham
(74) *Attorney, Agent, or Firm* — Crowe & Dunlevy

(57) ABSTRACT

The present disclosure relates to a method for forming a cavity that traverses a stack of layers including a bottom layer, a first portion of which locally presents an excess thickness, the method comprising a first step of non-selective etching and a second step of selective etching vertically in line with the first portion.

29 Claims, 7 Drawing Sheets

(56) References Cited

U.S. PATENT DOCUMENTS

2018/0286707 A1\* 10/2018 Hudson ............. H01J 37/32422
2020/0098586 A1\* 3/2020 Xia ................... H01L 21/67069
2021/0358925 A1\* 11/2021 Takahashi ......... H01L 29/40111

\* cited by examiner

ETCHING METHOD

PRIORITY CLAIM

This application claims the priority benefit of French Application for Patent No. 1874151, filed on Dec. 26, 2018, the content of which is hereby incorporated by reference in its entirety to the maximum extent allowable by law.

TECHNICAL FIELD

The present disclosure relates to methods for manufacturing electronic chips and is directed more specifically to a method for etching a cavity in a stack of layers for the manufacture of an electronic chip.

BACKGROUND

In some fields, there is a need for electronic chips comprising cavities with relatively substantial dimensions, formed in a stack of layers covering the substrate of the chip. The manufacture of a cavity with such dimensions, however, poses various problems.

There is a need in the art to address the drawbacks of known methods for forming cavities.

SUMMARY

One embodiment provides a method for forming a cavity that traverses a stack of layers including a bottom layer a first portion of which locally presents an excess thickness, the method comprising a first step of non-selective etching and a second step of selective etching vertically aligned with the first portion.

According to an embodiment, all dimensions of the opening of the cavity are greater than 100 μm.

According to an embodiment, the second etching step etches the bottom layer of the stack more slowly than a layer covering the bottom layer of the stack.

According to an embodiment, the second etching step etches the bottom layer of the stack between 8 and 10 times more slowly than the layer covering the bottom layer of the stack.

According to an embodiment, the first etching step etches the materials of all the layers of the stack at substantially the same speed.

According to an embodiment, the stack comprises an alternation of first and second layers, the bottom layer of the stack being one of the first layers.

According to an embodiment, the first layers are made of silicon nitride and the second layers are made of silicon oxide.

According to an embodiment, the first portion has a thickness of less than three times the thickness of the rest of the bottom layer.

According to an embodiment, the first portion has a thickness of less than 200 nm.

According to an embodiment, the first and second etching steps are performed with a same etching mask.

According to an embodiment, the mask of the second etching step has an opening all dimensions of which are less than the dimensions of the opening of the mask of the first etching.

According to an embodiment, the formation of the bottom layer comprises: forming an area made of the material of the bottom layer the thickness of which is substantially equal to the difference between the thickness of the first portion and that of the bottom layer outside the first portion and the horizontal dimensions of which are substantially equal to the dimensions of the first portion; and forming a layer made of the material of the bottom layer the thickness of which is substantially equal to that of the bottom layer outside the first portion.

According to an embodiment, the formation of the bottom layer comprises: forming a layer having the thickness of the first portion; etching the layer outside the site of the first portion so as to reach the thickness of the bottom layer outside the first portion.

According to an embodiment, the formation of the bottom layer comprises: etching a first layer located under the bottom layer so as to form a cavity the depth of which is substantially equal to the difference between the thickness of the first portion and that of the bottom layer outside the first portion and the horizontal dimensions of which are substantially equal to the dimensions of the first portion; forming the bottom layer in and outside the cavity, the upper face of the bottom layer being substantially plane.

According to an embodiment, the method comprises a step of etching the bottom layer of the stack.

A further embodiment provides an electronic device comprising a cavity that traverses a stack of layers, the stack of layers including a bottom layer at least a portion of which presents an excess thickness forming a part of the walls of the cavity.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may have identical structural, dimensional and material properties.

For the sake of clarity, only the operations and elements that are useful for an understanding of the described embodiments herein have been illustrated and described in detail.

Unless indicated otherwise, when reference is made to two elements that are connected together, this means a direct connection without any intermediate elements other than conductors, and when reference is made to two elements that are linked or coupled together, this means that these two elements can be connected or be linked or coupled by way of one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Chips used in integrated photonics can comprise a substrate, for example made of silicon, containing optical components, and a stack of layers, for example of insulating layers, that cover the substrate. In order to connect an optical fiber external to the chip to the optical components of the substrate, it would be desirable to be able to form, in the stack of layers covering the substrate, a cavity with dimensions that are substantial enough to receive an end of the optical fiber, for example a cavity with horizontal dimensions that can reach a few millimeters and a depth of several micrometers.

Figure 1:
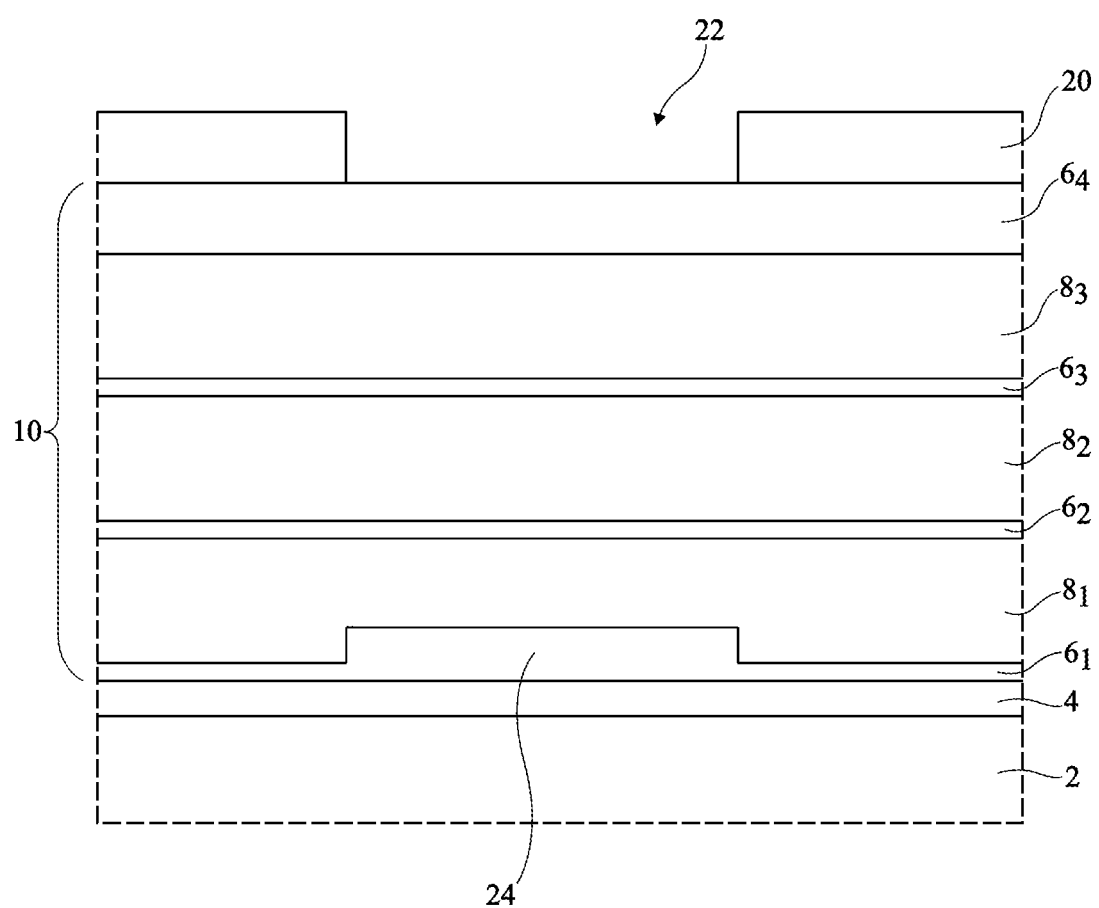
FIG. 1 is a partial and schematic sectional view illustrating the result of a phase of an embodiment of a method for forming a cavity.

FIG. 1 is a partial and schematic sectional view illustrating the result of a phase of an embodiment of a method for forming a cavity with relatively substantial dimensions in a chip.

During this phase, electronic components (not illustrated) are formed in and/or on a substrate 2, for example a semiconductor substrate, for example made of silicon. These components are, for example, optical, electronic or optoelectronic components. An insulating layer 4 (PMD—Pre-Metal Dielectric), for example made of silicon oxide, is formed on the upper face of the substrate 2. This phase further comprises a step of forming a stack 10 on the upper face of the insulating layer 4.

The stack 10 comprises, for example, an alternation of layers 6 ($6_1$, $6_2$, $6_3$, $6_4$) each made solely of a first insulating material and of layers 8 ($8_1$, $8_2$, $8_3$) each made solely of a second insulating material. The first material is, for example, silicon nitride. The second material is, for example, silicon oxide. More specifically, in the illustrated example, the stack 10 comprises, in order, starting from the upper face of the layer 4: a layer $6_1$ made of silicon nitride, a layer $8_1$ made of silicon oxide, a layer $6_2$ made of silicon nitride, a layer $8_2$ made of silicon oxide, a layer $6_3$ made of silicon nitride, a layer $8_3$ made of silicon oxide and a layer $6_4$ made of silicon nitride.

The layer $6_1$, i.e. the bottom layer of the stack 10, comprises a portion 24 presenting an excess thickness relative to a portion of layer $6_1$ on opposite sides of (perhaps surrounding) the portion 24, in other words there is a portion laterally outside of the portion 24. The upper surface of portion 24 extends parallel to the upper surface of the underlying layer 4, with lateral side edges of the portion 24 generally extending perpendicular to the upper surface of layer 4. The portion 24 is located facing (i.e., vertically aligned with) an opening 22 in a mask 20. In the embodiment described in relation to FIG. 1, the surface size and shape in a horizontal plane of the portion 24 is substantially equal to the surface size and shape in a horizontal plane of the opening 22. As a variant, the surface size and shape of the portion 24 could be greater than that of the opening, although the portion 24 may not constitute the entire layer $6_1$ in the final chip.

More generally, the stack comprises a minimum of a layer $6_1$ of the first material, constituting the bottom layer of the stack, and a layer $8_1$ of the second material, formed on and in contact with the layer $6_1$. The layer $8_1$ can then be covered with any number of alternating layers 6 and 8, the top layer of the stack potentially being a layer 6 of the first material or a layer 8 of the second material. Preferably, the stack comprises at least two layers $6_1$ and $6_2$ of the first material separated by the layer $8_1$ of the second material. The total thickness of the stack is, for example, comprised between 1 and 20 µm.

As a variant, the stack 10 can comprise layers made of other materials above the included layers $6_1$ and $8_1$.

The stack 10 is, for example, a stack of interconnecting layers comprising, in addition to the insulating layers 6 and 8, conductive interconnection paths (not shown in the figure) by means of which it is possible to couple components of the chip with one another and/or to terminals for connecting the chip to a device external to the chip. In this example, the cavity will be formed in a zone of the stack 10 that does not comprise conductive interconnection paths. The portion 24 thus extends in this zone only. The thickness of the layer $6_1$ outside the portion 24 is, for example, chosen so as to correspond to the characteristics of an interconnecting stack.

The thickness of the portion 24 is, for example, is greater than the thickness of the layer $6_1$ laterally outside the portion 24 and may, for example, be as thick as three times the thickness of the layer $6_1$ laterally outside the portion 24. For example, the thickness of the portion 24 is greater than 30 nm and less than 200 nm. As a variant, the portion 24 can have a thickness such that the upper surface of portion 24 reaches the lower surface of layer $6_2$, in other words, the thickness of portion 24 extends completely through the thickness of layer $8_1$.

The step of forming the stack 10 is followed by the deposition of a mask 20 on the top layer of the stack 10, here on the layer $6_4$. The mask 20 comprises an opening located at the site where a cavity will be formed and the horizontal dimensions of which, i.e. the dimensions when viewed from above, are substantially equal to those of the opening of the cavity it is desired to form. For example, the horizontal dimensions of the opening 22 are all greater than 100 µm, for example greater than 500 µm, for example greater than 1 mm.

Figure 2A:
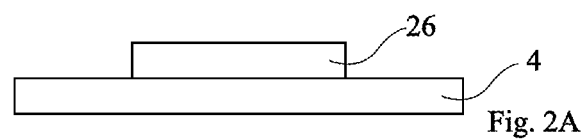
FIGS. 2A-2C illustrate schematically an example of a part of the phase the result of which is illustrated in FIG. 1.
Figure 2B:
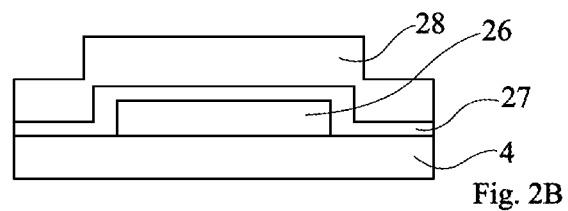
Figure 2C:
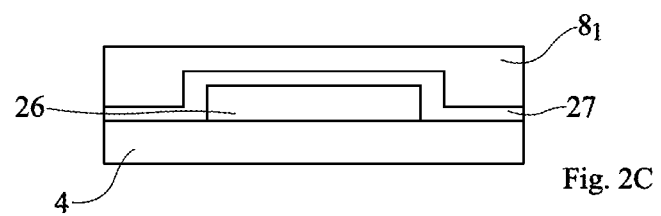

FIGS. 2A-2C illustrate schematically an example of a part of the process for making the result of which is illustrated in FIG. 1. This part of the process is a first example of a method for forming the portion 24 of the layer $6_1$ which has the greater thickness.

In FIG. 2A, the method comprises the formation, at the site of the portion 24, of an area 26 made of the material of the layer $6_1$ before the formation of the layer $8_1$. The thickness of the area 26 is substantially equal to the difference between the desired thickness of the portion 24 and the desired thickness of the rest of the layer $6_1$. In addition, the horizontal dimensions of the area 26 are preferably substantially equal to those of the portion 24. The horizontal dimensions of the area 26 may be less than those of the portion 24.

In FIG. 2B, a layer 27 made of the material of the layer $6_1$ is then formed on the area 26 and on the layer 4. The layer 27 has a thickness substantially equal to the thickness of the layer $6_1$ outside the portion 24. In addition, a layer 28 made of the material of the layer $8_1$ is, for example, formed on the layer 27. The thickness of the layer 28 is greater than or equal to the thickness of the layer $8_1$ facing the layer $6_1$, outside the portion 24.

In FIG. 2C, the layer 28 is, for example, planarized, so as to form the layer $8_1$. The area 26 and the layer 27 form the layer $6_1$.

Figure 3A:
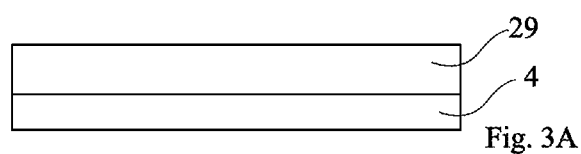
FIGS. 3A-3C illustrate schematically a further example of a part of the phase the result of which is illustrated in FIG. 1.
Figure 3B:
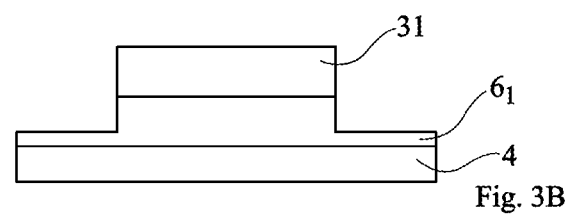
Figure 3C:
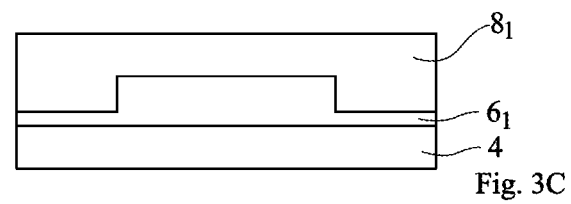

FIGS. 3A-3C illustrate schematically a further example of a part of the process of making the result of which is illustrated in FIG. 1. This part of the process is a second example of a method for forming the portion 24 of the layer $6_1$.

In FIG. 3A, the method comprises the formation of a layer 29 made of the material of the layer $6_1$ before the formation of the layer $8_1$. The layer 29 has a thickness substantially equal to the thickness of the portion 24.

In FIG. 3B, a mask 31 is formed at the desired site of the portion 24. The layer 29 is then etched outside the site of the portion 24, so as to obtain the desired thickness of the layer $6_1$ outside the portion 24.

In FIG. 3C, the mask 31 is removed and the layer $8_1$ is formed, for example as described in relation to FIG. 2.

FIGS. 4A-4D illustrate schematically a further example of a part of the process of making the result of which is illustrated in FIG. 1. This part of the process is a third example of a method for forming the portion 24 of the layer $6_1$.

Figure 4A:
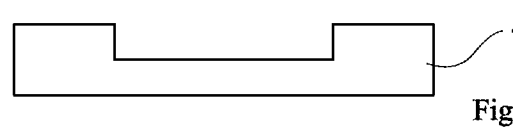
FIGS. 4A-4D illustrate schematically a further example of a part of the phase the result of which is illustrated in FIG. 1.

In FIG. 4A, the method comprises the etching of a cavity in the layer 4 at the site of the portion 24 before the formation of the layer $8_1$. The depth of this cavity is substantially equal to the difference between the desired thickness of the portion 24 and the desired thickness of the rest of the layer $6_1$. The horizontal dimensions of the cavity are substantially equal to those of the portion 24.

Figure 4B:
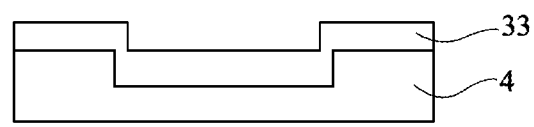

In FIG. 4B, a layer 33 made of the material of the layer $6_1$ is deposited on the layer 4, the thickness of the layer 33 being greater than or equal to the depth of the cavity. The layer 33 thus fills the cavity in the layer 4.

Figure 4C:
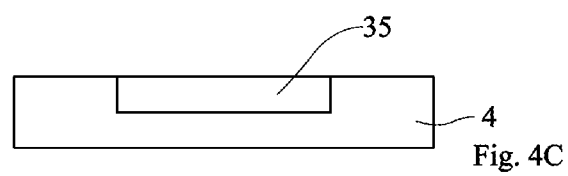

In FIG. 4C, the layer 33 is then partially removed so as to retain only a part 35 which fills the cavity and the upper face of which is coplanar with the upper face of the layer 4.

Figure 4D:
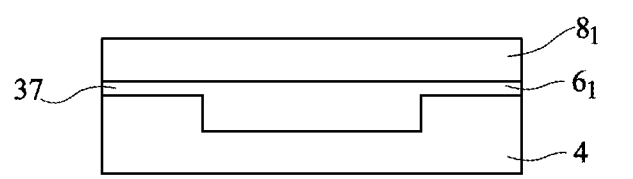

In FIG. 4D, a layer 37 made of the material of the layer $6_1$ and having a thickness substantially equal to the thickness of the layer $6_1$ outside the portion 24 is formed on the layer 4 and on the part 35. Thus, the upper face of the layer $6_1$ is substantially plane. The layer 37 and the part 35 form the layer $6_1$. The layer $8_1$ is then formed on the layer $6_1$.

As a variant, the thickness of the layer 33 can be greater than or equal to the thickness of the portion 24. The layer 33 is planarized, for example by a chemical mechanical planarization (CMP) process, so that its thickness is equal to the desired thickness in and outside the portion 24. The layer 37 is thus not formed. The upper face of the layer $6_1$ is thus substantially planar.

Figure 5:
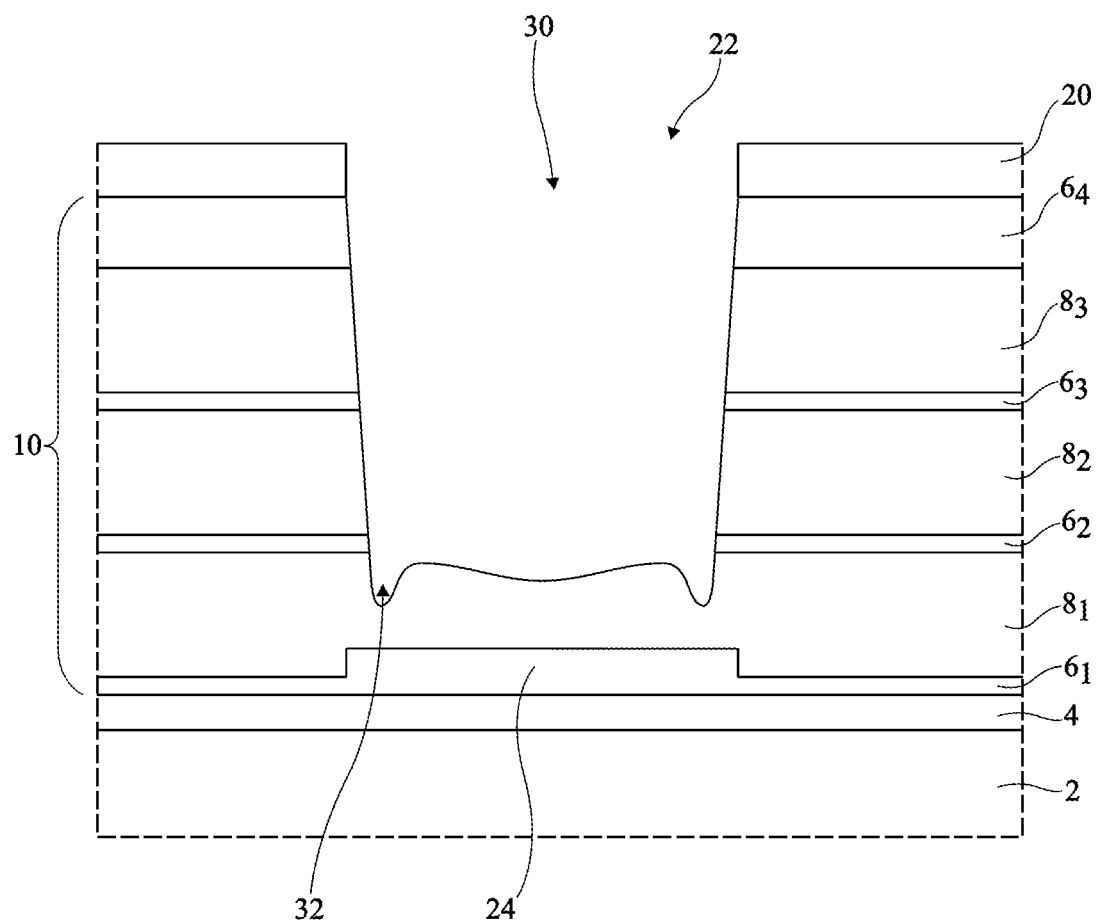
FIG. 5 is a partial and schematic sectional view illustrating the result of a further phase of an embodiment of a method for forming a cavity.

FIG. 5 is a partial and schematic sectional view illustrating the result of a further phase of an embodiment of a method for forming a cavity.

During this manufacturing phase, a first etching step is performed through the opening 22 so as to form a first portion of the cavity indicated at opening 30. This first etching step is a non-selective etching, that is to say that the layers of the stack 10, here the layers 6 and 8, are etched substantially at the same speed.

The first etching step is, for example, configured to be stopped so that the floor of the cavity is located in only one layer of the stack 10, for example in a layer 8, preferably in the layer $8_1$. As a result of the etching process, the floor of the cavity is not, at this stage, flat. The obtained cavity comprises trenches 32 in a peripheral area of the floor of the cavity 30. Preferably, the trenches 32 do not reach the portion 24. For instance, during this etching step, 60 to 95% of the thickness of the stack 10 is removed. In addition, the central part of the floor of the cavity is not flat.

The mask 20 has been partially etched by the first etching. The thickness of the mask 20 after the first etching is thus less than that of the mask 20 as deposited.

This etching could be used alone to form a cavity, the etching time being set so as to come as close as possible to the layer 4 without etching the same. A drawback would be that the etching of the stack 10 would be performed faster in a peripheral area of the cavity than in a central area of the cavity. Thus, at the conclusion of the etching, the peripheral area of the cavity would be deeper than its central area and would comprise trenches (like those shown at reference 32). This is a phenomenon generally referred to as "trenching". The floor of the cavity would, by contrast, be substantially flat in the central area of the cavity. For instance, for a cavity having a central area with a depth of approximately 8 µm, the peripheral area could have an additional depth of approximately 400 nm with respect to the central area. With the etching being interrupted before the cavity reaches the layer 4 in its peripheral area, the floor of the cavity will be relatively far away from the layer 4 in the central area of the cavity.

Figure 6:
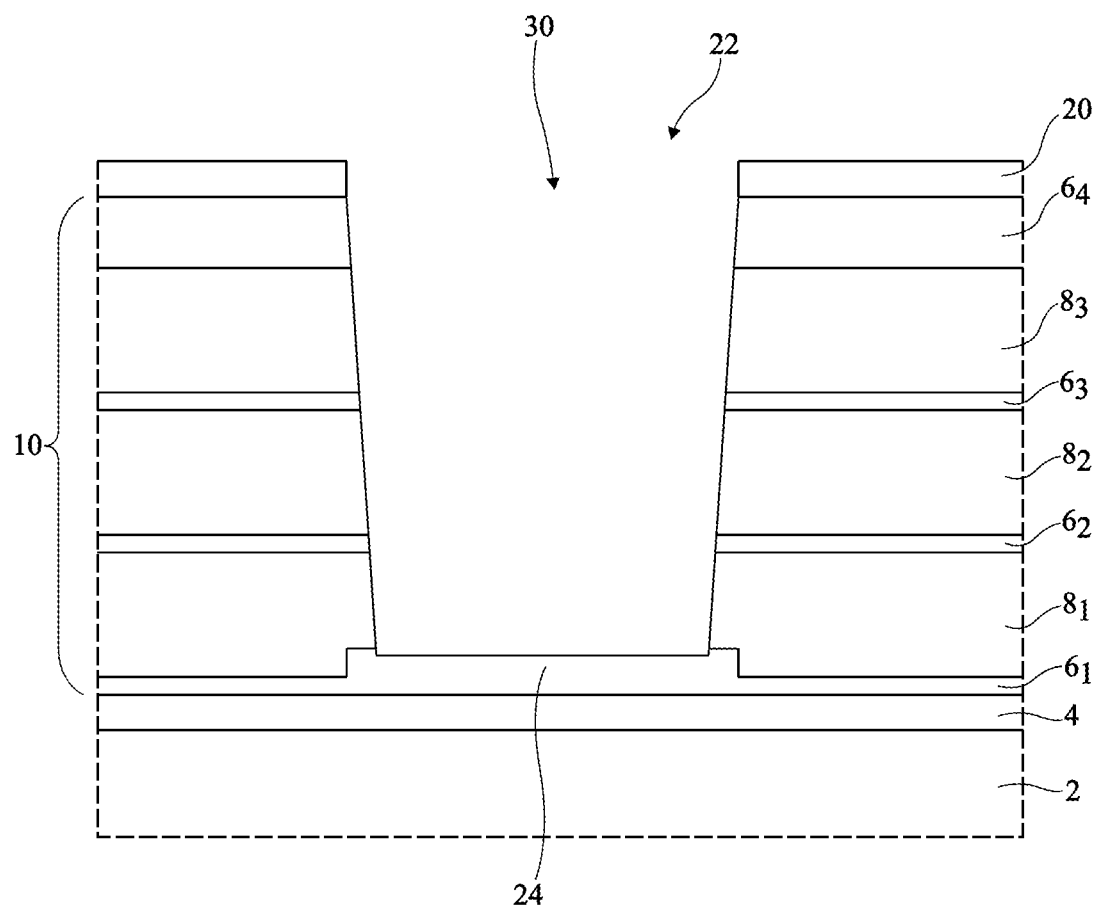
FIG. 6 is a partial and schematic sectional view illustrating the result of a further phase of an embodiment of a method for forming a cavity.

FIG. 6 is a partial and schematic sectional view illustrating the result of a further phase of an embodiment of a method for forming a cavity.

During this phase, a second etching is performed to produce a second portion of the cavity 30. The second etching is a selective etching of the material of the layer $8_1$ with respect to the material of the portion 24. For example, during this second etching, the material of the layer $8_1$ is etched between 8 and 10 times faster than the material of the portion 24.

The second etching is sustained until the portion of the layer $8_1$ located at the floor of the cavity 30 is etched and the portion 24 forms the floor of the cavity. More specifically, the portion of the layer $8_1$ located between the trenches 32 is etched. The floor of the cavity 30 is thus substantially flat. The portion 24 can be partially etched by the second etching step, some parts of the layer $8_1$ being etched more quickly than others. By means of the excess thickness of the portion 24, it is possible to ensure that the second etching does not reach the layer 4, the etching of which is not desired. This is all the more important in cases where, as in this example, the layer 4 is made of the same material as the layer $8_1$.

As a variant, the first etching described in relation to FIG. 3 can be stopped in a layer other than the layer $8_1$, for example a further layer 8. The second etching can thus comprise a plurality of selective etching steps that remove the layers of the stack one by one until the portion 24 is reached.

Figure 7:
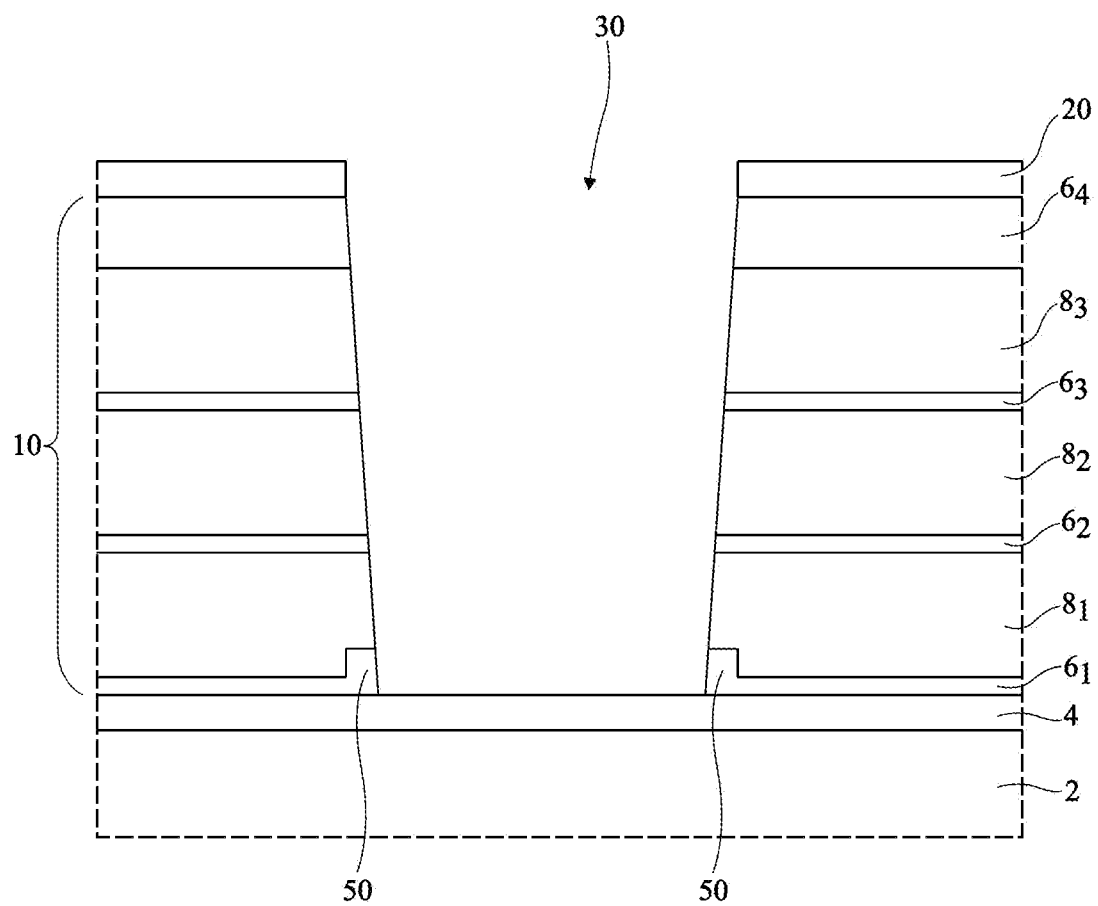
FIG. 7 is a partial and schematic sectional view illustrating the result of a further phase of an embodiment of a method for forming a cavity.

FIG. 7 is a partial and schematic sectional view illustrating the result of a further phase of an embodiment of a method for manufacturing a cavity.

During this phase, a third etching is performed to produce a third portion of the cavity 30. The third etching is a selective etching of the material of the portion 24 with respect to the material of the layer beneath the stack, here the layer 4. The third etching is sustained during a relatively short period of time and makes it possible to etch the part of the portion 24 located at the floor of the cavity 30 in a substantially plane manner until the layer 4 is reached.

The layer 4 is not etched by the third etching. Indeed, the portion 24 has a substantially constant thickness and is etched at substantially the same speed at every point.

The third etching does not etch the portion 24 entirely, and parts 50 of the portion 24, having an excess thickness, remain after the third etching. These parts 50 are located at the walls of the cavity 30 and form a part of the walls of the cavity 30.

Another possibility would be to provide an etching method comprising the successive etching of the layers 6 and 8 by selective etching methods, i.e. suitable for successively etching each layer of the stack in a selective manner with respect to the material of the underlying layer, for example for etching each layer 6 in a selective manner with respect to the material of the underlying layer 8, and each layer 8 in a selective manner with respect to the material of the underlying layer 6. Selective etching should be understood as an etching method that is adapted to selectively etch a first material with respect to a second material, i.e. adapted to etch the first material at least twice as fast as the second material, preferably at least three times as fast. This method has the advantage of reducing the magnitude of the trenching phenomenon, but has the drawback that it is slow and expensive.

An advantage of the described embodiments is that they make it possible to form a cavity with substantial dimensions and with a substantially flat floor. In particular, an advantage is to be able to avoid the presence of trenches in the periphery of the floor of the cavity.

A further advantage of the described embodiments is that they make it possible to form a cavity with substantial dimensions and with a substantially planar floor from a stack comprising at least one layer the thickness of which, at the site where the cavity will be formed, is different from the thickness along the rest of the chip, this difference in thickness potentially being related to variabilities in the various methods for manufacturing the stack.

A further advantage of the described embodiments is that the layer on which the stack lies is neither corroded nor damaged by the etching steps.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

The invention claimed is:

1. A method, comprising:
    forming a stack of alternating layers including a bottom layer made solely of a first insulating material, a first layer made solely of a second insulating material which covers the bottom layer, a second layer made solely of the first insulating material which covers the first layer and a third layer made solely of the second insulating material which covers the second layer, wherein the bottom layer includes a first portion having a first thickness and a second portion outside of the first portion having a second thickness less than the first thickness;
    forming a cavity that traverses the stack of layers, wherein forming the cavity comprises:
        performing a first step of a non-selective etching configured to remove the first and second insulating materials of the first, second and third layers of the stack at substantially a same speed and produce a first portion of the cavity having a depth extending into said first layer but which does not reach an upper surface of the first portion of the bottom layer; and
        performing a second step of a selective etching configured to remove the second insulating material of the first layer of the stack which covers the bottom layer at a faster speed than removing the first insulating material of the bottom layer underneath said first layer to produce a second portion of the cavity that reaches at least the upper surface of the first portion, wherein the second portion of the cavity is vertically in line with the first portion of the bottom layer.

2. The method according to claim 1, wherein all dimensions of an opening for the cavity are greater than 100 µm.

3. The method according to claim 1, wherein said faster speed etches the second insulating material of the first layer of the stack between 8 and 10 times faster than etching the first insulating material of the bottom layer of the stack.

4. The method according to claim 1, wherein the first insulating material is silicon nitride and the second insulating material is silicon oxide.

5. The method according to claim 1, wherein the first portion of the bottom layer has a thickness greater than 30 nm.

6. The method according to claim 1, wherein the first portion of the bottom layer has a thickness of less than three times a thickness of the second portion of the bottom layer.

7. The method according to claim 1, wherein the first portion of the bottom layer has a thickness less than 200 nm.

8. The method according to claim 1, wherein the first and second steps are performed with a same etching mask.

9. The method according to claim 1, wherein a mask for the second step has an opening whose dimensions are less than dimensions of an opening of a mask for the first step.

10. The method according to claim 1, wherein forming the stack comprises forming the bottom layer by:
    forming an area made of the first material having a thickness that is substantially equal to a difference between a thickness of the first portion of the bottom layer and a thickness of the second portion of the bottom layer outside of the first portion and having the horizontal dimensions that are substantially equal to dimensions of the first portion of the bottom layer; and
    forming a layer made of the first material on said area, wherein the layer has a thickness which is substantially equal to a thickness of the second portion of the bottom layer outside the first portion of the bottom layer.

11. The method according to claim 1, wherein forming the stack comprises forming the bottom layer by:
    forming a layer having the thickness of the first portion of the bottom layer;
    etching the layer outside a site of the first portion of the bottom layer so as to reach a thickness of the second portion of the bottom layer outside the first portion.

12. The method according to claim 1, wherein forming the stack comprises forming the bottom layer by:
    etching a first layer located under the bottom layer so as to form a cavity, the depth of which is substantially equal to a difference between a thickness of the first portion of the bottom layer and a thickness of the bottom layer outside the first portion and having horizontal dimensions that are substantially equal to dimensions of the first portion of the bottom layer;
    forming the bottom layer in and outside the cavity, the upper face of the bottom layer being substantially planar.

13. The method according to claim 1, wherein forming the cavity further comprises performing a third step of etching through the first portion of the bottom layer of the stack while leaving in place peripheral portions of the first portion on opposite sides of the cavity.

14. A method, comprising:
forming a stack of layers including:
a first layer made solely of a first insulating material and having a planar bottom surface, said first layer having a first portion with a first thickness measured from the planar bottom surface and a second portion adjacent the first portion having a second thickness measured from the planar bottom surface, wherein the second thickness is less than the first thickness;
a second layer made solely of a second insulating material, said second layer covering and in contact with a top surface of the first layer;
forming a cavity that passes completely through the second layer, wherein forming the cavity comprises:
performing a first step of etching the second layer to produce a first portion of the cavity having a depth which does not reach the top surface of the first layer at the first portion; and
performing a second step of a selective etching which etches the first insulating material of the first layer of the stack under the second layer more slowly than it etches the second insulating material of the second layer covering said first layer to produce a second portion of the cavity that reaches at least the top surface of the first layer at the first portion, wherein the second portion of the cavity is vertically in line with the first portion of the first layer.

15. The method according to claim 14, wherein the first layer is made of silicon nitride and the second layer is made of silicon oxide.

16. The method according to claim 14, wherein the first portion of the first layer has a thickness greater than 30 nm.

17. The method according to claim 14, wherein the first portion of the first layer has a thickness of less than three times a thickness of the second portion of the first layer.

18. The method according to claim 14, wherein the first portion of the first layer has a thickness less than 200 nm.

19. The method according to claim 14, wherein the first and second steps are performed with a same etching mask.

20. The method according to claim 14, wherein a mask for the second step has an opening whose dimensions are less than dimensions of an opening of a mask for the first step.

21. The method according to claim 14, wherein forming the cavity further comprises performing a third step of etching completely through the first portion of the first layer of the stack while leaving in place peripheral portions of the first portion on opposite sides of the cavity.

22. A method, comprising:
forming a stack of layers including:
a first layer made solely of a first insulating material and having a planar top surface, said first layer having a first portion with a first thickness measured from the planar top surface and a second portion adjacent the first portion having a second thickness measured from the planar top surface, wherein the second thickness is less than the first thickness;
a second layer made solely of a second insulating material, said second layer covering and in contact with the planar top surface of the first layer;
forming a cavity that passes completely through the second layer, wherein forming the cavity comprises:
performing a first step of etching said second layer to produce a first portion of the cavity having a depth into said second layer which does not reach the planar top surface of the first layer at the first portion; and
performing a second step of a selective etching which etches the first insulating material of the first layer of the stack under the second layer more slowly than it etches the second insulating material of the second layer covering said first layer to produce a second portion of the cavity that reaches at least the planar top surface of the first layer at the first portion, wherein the second portion of the cavity is vertically in line with the first portion of the first layer.

23. The method according to claim 22, wherein the first layer is made of silicon nitride and the second layer is made of silicon oxide.

24. The method according to claim 22, wherein the first portion of the first layer has a thickness greater than 30 nm.

25. The method according to claim 22, wherein the first portion of the first layer has a thickness of less than three times a thickness of the second portion of the first layer.

26. The method according to claim 22, wherein the first portion of the first layer has a thickness less than 200 nm.

27. The method according to claim 22, wherein the first and second steps are performed with a same etching mask.

28. The method according to claim 22, wherein a mask for the second step has an opening whose dimensions are less than dimensions of an opening of a mask for the first step.

29. The method according to claim 22, wherein forming the cavity further comprises performing a third step of etching completely through the first portion of the first layer of the stack while leaving in place peripheral portions of the first portion on opposite sides of the cavity.

* * * * *